(12) United States Patent
Rothacher et al.

(10) Patent No.: US 9,168,524 B2
(45) Date of Patent: Oct. 27, 2015

(54) MICROFLUIDIC STORAGE DEVICE FOR PRE-STORING OF FLUID, METHOD FOR ITS PRODUCTION AND A USE THEREOF

(71) Applicant: Robert Bosch GmbH, Stuttgart (DE)

(72) Inventors: Peter Rothacher, Bruchsal (DE); Thomas Brettschneider, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/934,619

(22) Filed: Jul. 3, 2013

(65) Prior Publication Data

US 2014/0023564 A1   Jan. 23, 2014

(30) Foreign Application Priority Data

Jul. 19, 2012   (DE) .......................... 10 2012 212 650

(51) Int. Cl.
*B01L 3/00* (2006.01)
*B32B 3/08* (2006.01)
(Continued)

(52) U.S. Cl.
CPC ......... *B01L 3/5027* (2013.01); *B01L 3/502707* (2013.01); *B29C 65/168* (2013.01); *B29C 65/1635* (2013.01); *B29C 65/1654* (2013.01); *B29C 66/112* (2013.01); *B29C 66/114* (2013.01); *B29C 66/1142* (2013.01); *B29C 66/53461* (2013.01); *B29C 66/5412* (2013.01); *B29C 66/81267* (2013.01); *B29C 66/8322* (2013.01); *B81C 3/001* (2013.01); *B01L 3/50273* (2013.01); *B01L 3/502715* (2013.01); *B01L 3/502723* (2013.01); *B01L 3/502738* (2013.01); *B01L 2200/0684* (2013.01); *B01L 2200/0689* (2013.01); *B01L 2200/16* (2013.01); *B01L 2300/0816* (2013.01); *B01L 2300/0887* (2013.01); *B01L 2300/123* (2013.01);

(Continued)

(58) Field of Classification Search
None
See application file for complete search history.

(56) References Cited

U.S. PATENT DOCUMENTS 5,932,799 A * 8/1999 Moles .......................... 73/53.01
2005/0026134 A1 * 2/2005 Miller et al. ...................... 435/3
(Continued)

FOREIGN PATENT DOCUMENTS

DE   10 2010 028 524 A1   11/2011
WO   WO 2011138070 A1 *  11/2011

OTHER PUBLICATIONS

Findlay et al.; Automated Closed-Vessel System for in Vitro Diagnostics Based on Polymerase Chain Reaction; Clinical Chemistry; 1993; pp. 1927-1933; vol. 39, Issue 9.
(Continued)

*Primary Examiner* — Jennifer Wecker
(74) *Attorney, Agent, or Firm* — Maginot, Moore & Beck LLP

(57) ABSTRACT

A microfluidic storage device for pre-storing a fluid includes a first substrate, a second substrate, and a membrane. The first substrate has a recess formed in a first surface. The second substrate has a second surface formed to form fit with the first surface at least in subregions outside the recess. The membrane is arranged between the first and second substrates and is in contact with the first and second surfaces in regions outside the recess. In the region of the recess, the membrane is configured to line the recess so that a volume region inside the recess, between the membrane and the second substrate, can be filled with the fluid. The first substrate, the membrane, and the second substrate are configured to be joined together at least in subregions, outside the recess, in which the membrane is in contact with the first and second surfaces.

16 Claims, 7 Drawing Sheets

(51) Int. Cl.
  *B29C 65/00* (2006.01)
  *B29C 65/16* (2006.01)
  *B81C 3/00* (2006.01)
  *F04B 43/12* (2006.01)
  *F04B 43/06* (2006.01)
  *F04B 43/073* (2006.01)
  *F16K 99/00* (2006.01)
  *B29L 31/00* (2006.01)

(52) U.S. Cl.
  CPC .. *B01L2400/0481* (2013.01); *B01L 2400/0638* (2013.01); *B01L 2400/0683* (2013.01); *B29C 65/1638* (2013.01); *B29L 2031/756* (2013.01); *F16K 2099/0084* (2013.01)

(56) References Cited

U.S. PATENT DOCUMENTS

| | | | | |
|---|---|---|---|---|
| 2005/0266582 A1* | 12/2005 | Modlin et al. | | 436/164 |
| 2008/0063543 A1* | 3/2008 | Xu et al. | | 417/395 |
| 2010/0200092 A1* | 8/2010 | Beltram et al. | | 137/828 |
| 2011/0036152 A1* | 2/2011 | Park et al. | | 73/64.56 |
| 2011/0305607 A1* | 12/2011 | Jung et al. | | 422/502 |
| 2012/0298233 A1* | 11/2012 | Rothacher | | 137/613 |
| 2013/0087226 A1* | 4/2013 | Weber | | 137/561 A |
| 2014/0045275 A1* | 2/2014 | Rothacher et al. | | 436/180 |

OTHER PUBLICATIONS

Jokerst et al.; Clinical Applications of a Programmable Nano-Bio-Chip; Clinical Laboratory International; Nov. 2009; pp. 24-27; vol. 33, Issue 6.

Rupp; Multilayer Pressure Driven Microfluidic Platform—µFLATLab; Albert-Ludwigs University, Freiburg im Breisgau; May 24, 2011; 125 pages; Stuttgart, Germany.

Xie et al.; Development of a Disposable Bio-Microfluidic Package With Reagents Self-Contained Reservoirs and Micro-Valves for a DNA Lab-on-a-Chip (LOC) Application; IEEE Transactions on Advanced Packaging; May 2009; pp. 528-535; vol. 32, No. 2.

Manuela Schmidt; PhD thesis Untersuchung zum Aufbau hybrider Mikrosysteme unter Verwendung von Polymermaterialien; Mar. 8, 2012; pp. 1-194; XP055084729, English abstract on pp. IV-VI.

* cited by examiner

MICROFLUIDIC STORAGE DEVICE FOR PRE-STORING OF FLUID, METHOD FOR ITS PRODUCTION AND A USE THEREOF

This application claims priority under 35 U.S.C. §119 to patent application no. DE 10 2012 212 650.3, filed on Jul. 19, 2012 in Germany, the disclosure of which is incorporated herein by reference in its entirety.

BACKGROUND

The disclosure relates to a microfluidic storage device for pre-storing of fluid, to a method for its production and to a use thereof.

Lab-on-a-chip (LOC) systems are used in order to allow laboratory processes, which have previously been carried out by hand, to take place in an automated fashion in an integrated system. To this end, an LOC system comprises channels and cavities which, for example, are formed as mixing cavities or offer the possibility of allowing biochemical reactions to take place in the predetermined miniaturized volume region. The fluids or liquids necessary for this are either supplied from the outside via fluidic interfaces or pre-stored in the LOC system. Pre-storage makes it possible, inter alia, for the entire microfluidic system to remain closed and for a contamination risk to be reduced.

LOC systems often consist of a polymer layer system which is joined together during the construction or production process. For example, laser welding is used as the joining technology. During laser welding, a laser beam passes through a transparent assembly partner onto a light-absorbing assembly partner, the materials at the interface of the assembly partners being liquefied and mixing of the materials and a material-fit connection taking place. During the joining process, a force, or a compression pressure, may be exerted on the layer structure in order to ensure good contact between the assembly partners. To this end, the layer structure to be assembled is conventionally clamped between a base plate and a transparent pressure plate, for example a glass plate, so that the laser radiation can pass through the pressure plate, for example the glass plate, onto a surface region of the light-absorbing assembly partner.

The previously used possibilities for pre-storage of fluids or liquids in polymer layer systems, for instance LOC systems, include blister packages, integrated in the system, for pre-storing the fluids or reagents. A first example relating to this is an LOC system which is described in the article "Automated Closed-Vessel System for in Vitro Diagnostics Based on Polymerase Chain Reaction" by J. B. Findlay et al., Clinical Chemistry, Vol. 39 (9), pages 1927-1933 (1993). This LOC system comprises a multiplicity of storage vessels consisting of bubble-shaped blister containers. These containers are unclosed, however, which greatly restricts the possibilities for practical use. A second example relating to this is mentioned in the article "Clinical applications of a programmable nano-bio-chip" by J. V. Jokerst et al., Clinical Laboratory International, Vol. 33 (6), pages 24-27 (November 2009), relating to an exemplary commercially available nano-bio-chip from the company LabNow. In this case, burst valves are integrated in the system (microfluidic chip) in order to release the reagents from the blister packages, although it is difficult in terms of manufacturing technology to produce these valves with high process reliability.

The known possibilities for pre-storing fluids or liquids in polymer layer systems furthermore include dispensing fluids into previously formed cavities in a polymer layer and subsequently joining together the layer structure, for example by means of laser beam transmission welding, as described for instance in the dissertation (Ph.D. thesis) "Multilayer Pressure Driven Microfluidic Platform—µFLATLab" by J. Rupp, which was submitted to the technical faculty of Albert-Ludwigs University in Freiburg im Breisgau on 24, May 2011 (see http://www.freidok.uni-freiburg.de/volltexte/8374/pdf/111129_Rp_Dissertation_actual.pdf).

SUMMARY

The disclosure relates to a microfluidic storage device having the features described below, to a use thereof, and to a method for its production, having the features described below. Advantageous embodiments of the storage device, and of the method, are the subject-matter of the below description.

The disclosure has the advantage of providing a microfluidic storage device and a method for its production, wherein a fluid, in particular a liquid, can be particularly advantageously pre-stored in a polymer layer system and can be introduced under closed conditions, that is to say without connection to the atmosphere or the surroundings, during a clamping process which is necessary in any case for the joining process, for example by means of laser welding.

A microfluidic storage device for pre-storing a fluid comprises: a first polymer substrate, having a first surface in which a laterally extending recess is formed, a second polymer substrate, having a second surface which is essentially formed so as to match the first surface with a form fit at least in subregions outside the recess or outside further structures formed in the first or second surface, an elastic polymer membrane which is arranged between the first and second polymer substrates, is in contact with the first and second surfaces in regions outside the recess and, in the region of the recess, can essentially line the latter so that essentially the volume region inside the recess, between the polymer membrane and the second polymer substrate, can be filled with the fluid. In this case, the first polymer substrate, the polymer membrane and the second polymer substrate can be joined to one another at least in subregions, outside the recess, in which the polymer membrane is in contact with the first and second surfaces.

When the elastic polymer membrane is pressed into the recess by the introduced fluid, a mechanical stress is set up in the polymer membrane and places the fluid under pressure (pre-pressure).

The storage of the fluid in the volume region within the recess between the polymer membrane and the second polymer substrate, as provided in the storage device according to the disclosure, makes it possible to configure the amount of fluid to be pre-stored by the volume (lateral extent and depth) of the recess within wide limits. Furthermore, owing to the polymer membrane pre-stressed into the recess, the pre-stored fluid is under a pre-pressure which can drive the emptying when the fluid is used.

The first polymer substrate may comprise the following: a first through-hole, a first auxiliary through-hole, which is formed between the first through-hole and the recess, a second through-hole, which is arranged essentially opposite the first through-hole in relation to the recess, and a second auxiliary through-hole, which is formed between the second through-hole and the recess. Preferably, in this embodiment, moreover, the first through-hole, the first auxiliary through-hole, the second through-hole and the second auxiliary through-hole may respectively open into the first surface. This configuration of the first polymer substrate makes it possible, during production of the microfluidic storage device, for the region in the recess intended for the pre-storage to be filled with the fluid through the first through-hole, and for the introduced fluid to be enclosed by applying positive pressures to the first and second auxiliary through-holes.

A venting channel may furthermore be formed in the first polymer substrate, in which case this venting channel may provide fluid communication between the recess and a space outside the storage device. The fluid communication from the recess to outside the storage device, which is provided by the venting channel, makes it possible for the fluid introduced through a through-hole during production of the storage device to displace air present in the recess substantially fully, so that the recess can be filled substantially fully with the fluid.

In the second polymer substrate, a first channel and a second channel may be formed in its second surface in such a way that, when the second surface of the second polymer substrate is applied onto the first surface of the first polymer substrate with the polymer membrane arranged between them, the first channel can connect together the region which is arranged in the second surface in extension of the first through-hole, the region which is arranged in the second surface in extension of the first auxiliary through-hole, and a closely lying first region which is arranged in the second surface, facing a subregion of the recess, and that the second channel can connect together the region which is arranged in the second surface in extension of the second through-hole, the region which is arranged in the second surface in extension of the second auxiliary through-hole, and a closely lying second region which is arranged in the second surface, facing a subregion of the recess. In a further configuration of the second polymer substrate, the first channel and the second channel may be connected together in the region which lies on the second surface, facing the recess. This connection may, for example, be carried out by means of a connecting channel. This configuration of the second polymer substrate makes it possible for the fluid introduced through the first or second through-hole during production of the microfluidic storage device to flow through the first or second channel, respectively, into the region in the recess intended for the pre-storage, and fill the latter.

The polymer membrane may, at least in regions outside the recess, be joined to the wall of the first channel in the region which is arranged in the second surface in extension of the first auxiliary through-hole, and to the wall of the second channel in the region which is arranged in the second surface in extension of the second auxiliary through-hole. In this way, the volume region in the recess intended for pre-storing the fluid can be peripherally sealed essentially fully by the joining of the polymer membrane to the first and second polymer substrates.

At least the volume region in the recess, between the polymer membrane and the second surface, may be filled with the fluid. In this case, the elastic polymer membrane is into the recess by the introduced fluid, and the resulting mechanical stress in the polymer membrane places the fluid under a pressure (pre-pressure). In a further configuration, the first polymer substrate, the polymer membrane and the second polymer substrate may be joined to one another at least in subregions, outside the recess, in which the polymer membrane is in contact with the first and second surfaces. In this way, the fluid occupies the volume region intended for the pre-storage and this volume region is peripherally sealed outward, or enclosed, essentially fully.

At least the first through-hole, the first auxiliary through-hole, the second through-hole or the second auxiliary through-hole may be closed by a polymer stamp. Preferably, all these holes (that is to say the first and second through-holes as well as the first and second auxiliary through-holes) are closed by a polymer stamp. The polymer stamp or stamps lead to additional sealing, or enclosure, of the fluid in the volume region in the recess intended for the pre-storage.

The storage device may furthermore comprise at least one breakthrough valve having a valve antechamber. In this case, the breakthrough valve may be formed in the first polymer substrate and the valve antechamber may be in fluid communication with the recess. In a further preferred configuration, the breakthrough valve may be formed at least subregionally in relation to the first or second channel between the recess and the first or second auxiliary through-hole, respectively. The breakthrough valve makes it possible for the volume region holding the fluid to be opened outward, i.e. for the contained fluid to flow out, when the breakthrough valve has been opened.

The polymer membrane may be absorbent for light for which the first and second polymer substrates are transmissive, and which is suitable for joining the first polymer substrate to the polymer membrane and the second polymer substrate to the polymer membrane, in particular by means of laser welding, for example. This configuration permits effective joining of the polymer membrane to the first and second polymer substrates by means of laser welding during production of the microfluidic storage device.

The walls of the first and second channels may respectively be formed with a chamfer in the regions in which the polymer membrane is curved. This configuration makes it possible that the polymer membrane can contact the walls of the first or second channel essentially fully as far as the edge of the first or second channel, respectively.

The first and/or second polymer substrate may be produced from a thermoplastic material. In particular, the thermoplastic material may be selected from a group which consists of PC, PP, PE, PMMA, COP and COC. The polymer membrane may be produced from a material which is selected from a group which consists of elastomers, thermoplastic elastomers, thermoplastics and hot-melt adhesive films. These materials are commercially available and allow economical manufacture in terms of the raw material costs.

According to the disclosure, the microfluidic storage device described above is used, or may be used, in a lab-on-a-chip (LOC).

A method according to the disclosure for producing a microfluidic storage device for pre-storing a fluid comprises the following steps:
  (a) producing a first polymer substrate, having a first surface in which a laterally extending recess is formed, the first polymer substrate furthermore comprising a first through-hole, a first auxiliary through-hole, which is formed between the first through-hole and the recess, a second through-hole, which is arranged essentially opposite the first through-hole in relation to the recess, and a second auxiliary through-hole, which is formed between the second through-hole and the recess;
  (b) producing a second polymer substrate, having a second surface which is essentially formed so as to match the first surface with a form fit in regions outside the recess and in which a first channel and a second channel are formed, wherein, when the first surface of the first polymer substrate is applied onto the second surface of the second polymer substrate, the first channel connects together the region which is arranged in the second surface in extension of the first through-hole, the region which is arranged in the second surface in extension of the first auxiliary through-hole, and a closely lying first region which is arranged in the second surface, facing the recess, and the second channel connects together the region which is arranged in the second surface in extension of the second through-hole, the region which is arranged in the second surface in extension of the second auxiliary through-hole, and a closely lying second region which is arranged in the second surface, facing the recess;

(c) forming a stack arrangement comprising the first polymer substrate, the second polymer substrate and a polymer membrane, which is arranged between the first polymer substrate and the second polymer substrate;

(d) filling the first through-hole with the fluid until the fluid emerges through the second through-hole;

(e) applying a positive pressure to the second auxiliary through-hole, so that the polymer membrane is raised from the first polymer substrate in the region of the second auxiliary through-hole and is essentially pressed onto the wall of the second channel in this region;

(f) continuing to fill the first through-hole with the fluid until the polymer membrane has been pressed into the recess and essentially lines the recess, and the volume region between the polymer membrane and the second polymer substrate is filled essentially fully with fluid in the region of the recess;

(g) applying a positive pressure to the first auxiliary through-hole, so that the polymer membrane is raised from the first polymer substrate in the region of the first auxiliary through-hole and is essentially pressed onto the wall of the first channel in this region;

(h) joining the polymer membrane in the regions of the first and second auxiliary through-holes which are respectively in contact with the walls of the first and second channels; and (i) joining the remaining planar regions of the surfaces of the first and second polymer substrates to the polymer membrane at least in subregions outside the recess.

By this method, the storage device described above can be produced from relatively simply constructed or obtainable components (including the first polymer substrate, the polymer membrane and the second polymer substrate), and the first polymer substrate has the least possible number of through-holes.

In step (f), the elastic polymer membrane is pressed into the recess by the introduced fluid, and the mechanical stress thereby resulting in the polymer membrane places the fluid under a pressure (pre-pressure).

After step (h), the polymer membrane may be separated by a laser beam with a higher power of the laser in a first region, or a first separating position, which lies between the first bearing position, resulting in step (e), of the polymer substrate on the wall of the second channel and a first opening in the polymer membrane at a position in extension of the first through-hole, and in a second region at a second separating position, which lies between the second bearing position, resulting in step (g), of the polymer substrate on the wall of the first channel and a second opening in the polymer membrane at a position in extension of the second through-hole.

After the separation in the above-described first and second regions, or first and second separating positions, the positive pressure (pre-pressure) prevailing in the fluid with which the recess is filled can displace fluid lying outside the bearing positions in the first or second channel, respectively, at the first auxiliary through-hole or the second auxiliary through-hole, through the first through-hole or the second through-hole in the first polymer substrate, and can thereby discharge the excess fluid in a controlled way.

On the basis of a polymer layer system having two transparent polymer substrates comprising channels and chambers, which are separated by an absorbent flexible polymer membrane and are applied on one another with the introduced channels or chambers facing one another, one aspect of the method according to the disclosure consists in the fluidic contacting of the polymer layer system (comprising the first polymer substrate, the polymer membrane and the second polymer substrate) and the use of differential pressures inside the layer structure during the clamping in the course of the joining process (step (h)), for example a laser welding process. In this way, it is possible to deflect the flexible polymer membrane in a controlled way in a defined region of the polymer layer system during the clamping or pressing process in an external clamping holder, which consists for example of a first pressure plate (base plate) and a second pressure plate, and thereby press it against one of the polymer substrates. In this state, the polymer membrane can be joined to the polymer substrates, for example welded by the laser.

In step (a), the first through-hole, the first auxiliary through-hole, the second through-hole and the second auxiliary through-hole may respectively open into the first surface.

During step (c), the first and second polymer substrate may respectively be pressed against one another in a direction toward one another. Pressing them together supports the formation of a material-fit connection of the first and second polymer substrates to the polymer membrane applied between them during the joining.

The structures in the first surface of the first polymer substrate may be produced by milling, injection molding, hot pressing or laser structuring in step (a), and/or the structures in the second surface of the second polymer substrate may be produced by milling, injection molding, hot pressing or laser structuring in step (b). The breakthroughs in the polymer membrane in the regions of the first through-hole and/or of the second through-hole may be produced by stamping or laser structuring. These processing techniques are conventional and make it possible to provide the components (i.e. the first and second polymer substrates and the polymer membrane) and to form the structures with the required geometrical accuracy and with the known processing machines.

The joined polymer stack (i.e. the finished storage device) and the method may be used for pre-storing a fluid, for instance a sample or a reagent fluid. To this end, the layer structure described above is pressed together and thereby fluidically contacted. During the pressing process a fluid (for example a liquid) is introduced into the polymer layer system through a first access, which is implemented by the first or second through-hole in the first polymer substrate. Via a second and third fluidic access, which are pressure accesses and are implemented by the first and second auxiliary through-holes in the first polymer substrate, the polymer membrane is subsequently deflected in previously defined regions, particularly in the region of the recess (cavity), in such a way that it encloses the introduced fluid. In this state, the polymer membrane deflected into the recess, or cavity, is joined to the polymer substrate facing it in the regions surrounding the recess, or cavity.

The enclosed fluid may be emptied through burst valves, which are provided in the same polymer layer structure. Intended breaking positions, which can be broken by means of small stamps, are integrated in a burst valves. Since a polymer membrane, for example produced from an elastomer, is generally very permeable, it is not on its own suitable for long-term storage of fluids, in particular liquid reagents. If, however, the accesses for filling (in particular the first and second through-holes) and for applying pressures (in particular the first and second auxiliary through-holes) are closed and fused with an e.g. hot stamp, in addition to the joining of the polymer membrane, then in conjunction with the burst valve a fluid compartment enclosed by polymer on all sides (including in particular the recess) is formed, which is substantially permeation-tight and suitable for long-term pre-storage of liquid reagents (for example over a period of more than one year).

The burst valves described here may be constructed and simply mounted from a single economical injection-molded part. This is in contrast, for example, to the burst valves which are described in the article by Xie et al.: "Development of a disposable bio-microfluidic package with reagents self-contained reservoirs", IEEE Transactions on Advanced Packaging, Vol. 32 (2), pages 528 to 543 (May 2009). The burst valves described therein are produced by tubular microneedles which are relatively expensive to produce, and which are furthermore made of PDMS (polydimethylsiloxane, a silicon-based polymer), which does not ensure permeation sealing and is unsuitable for long-term storage.

The disclosure provides the following further advantages:
1. In comparison with previous storage devices, which have been produced for example in the form of blister packages integrated in the device, the process steps required beforehand (i.e. before the integration of the blister package in the device) of introducing and enclosing the fluid in the package, are obviated.
2. The process step of dispensing the fluid before the joining process (for example by laser welding) is obviated. This leads to lower production costs and faster process times.
3. When previously defined cavities, or blister packages, are filled with the fluids (samples and reagents) in air, cleanroom conditions during the production process are essential in order to avoid contamination. In the method according to the disclosure, however, the fluid to be introduced does not come into contact with the external environment at any time. Cleanroom conditions can therefore be obviated during production of the storage device.
4. Often, being able deliberately to empty again fluid pre-stored in a microfluidic system is problematic. If the flexibility of the polymer membrane is used, however, then fluids can be pre-stored under permanent pressure. When the fluid-filled recess (cavity) is opened, for example by means of said burst valves, the recess (cavity) can be emptied automatically without applying an additional pressure.
5. In general, it is very difficult to pre-store liquids without air bubble inclusions, or to empty them without bubbles into a microfluidic device. By the arrangement of the venting channel and of the filling and burst valves, is possible to avoid air bubbles when filling and emptying.
6. With the disclosed arrangement of filling and burst valves, fluids (samples and reagents) can be pre-stored in polymer structures having a low degree of permeation, so that long-term storage is possible.
7. Many previously known LOC systems are pressure-driven, that is to say the LOC contains fluidic connections to which different pressures are applied during operation, in order to achieve corresponding fluidic processes in the LOC. The storage device according to the disclosure makes it possible to pre-store fluids (liquids and gases) under pressure (the pre-pressure generated by the prestressed elastic polymer membrane) and to release these pre-stored fluids by mechanical actuation (for example of the burst valve). In this way, fluidic interfaces for controlling operational processes during operation can be obviated. This reduces the complexity of the associated external control units.

BRIEF DESCRIPTION OF THE DRAWINGS

The disclosure will be described in further detail below with the aid of embodiments of the disclosure which are represented in the appended figures. In the figures.

DETAILED DESCRIPTION

Figure 1A:
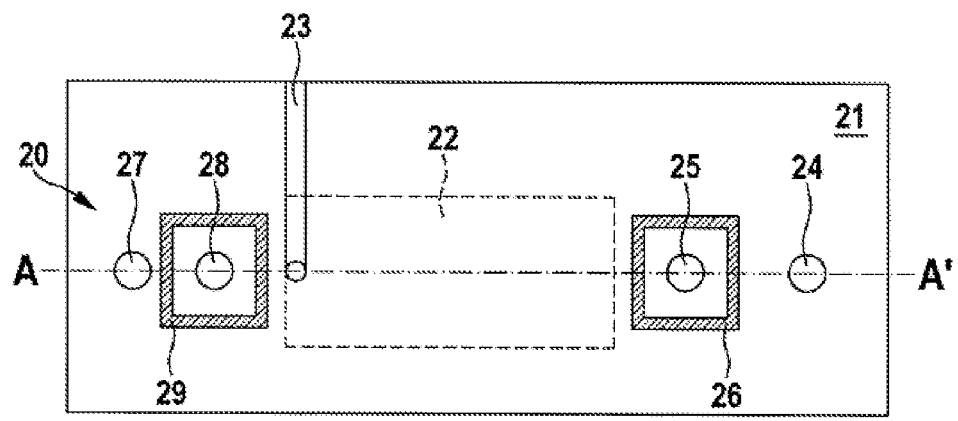
FIG. 1A shows a schematic plan view of the first polymer substrate.

FIGS. 1 to 7 show a microfluidic storage device according to a first embodiment of the disclosure and a method for its production. The completed microfluidic storage device 10 can be used for pre-storing a fluid 70, for example in a lab-on-a-chip (LOC) system. The storage device 10 comprises a first polymer substrate 20, having a first surface 21 in which a laterally extending recess 22 is formed, a second polymer substrate 40, having a second surface 41 which is essentially formed so as to match the first surface 21 with a form fit in the regions outside the recess 21, an elastic polymer membrane 60 which is arranged between the first and second polymer substrates 20, 40, is in contact with the first and second surfaces 21, 41 in regions outside the recess 22 and, in the region of the recess 22, essentially lines the latter. Thus, essentially the volume region inside the recess 22, between the polymer membrane 60 and the second polymer substrate 40, can be or is filled with the fluid. The first polymer substrate 20, the polymer membrane 60 and the second polymer substrate 40 can be or are joined to one another in regions, outside the recess 22, in which the polymer membrane 60 is in contact with the first and second surfaces 21, 41.

Figure 1B:
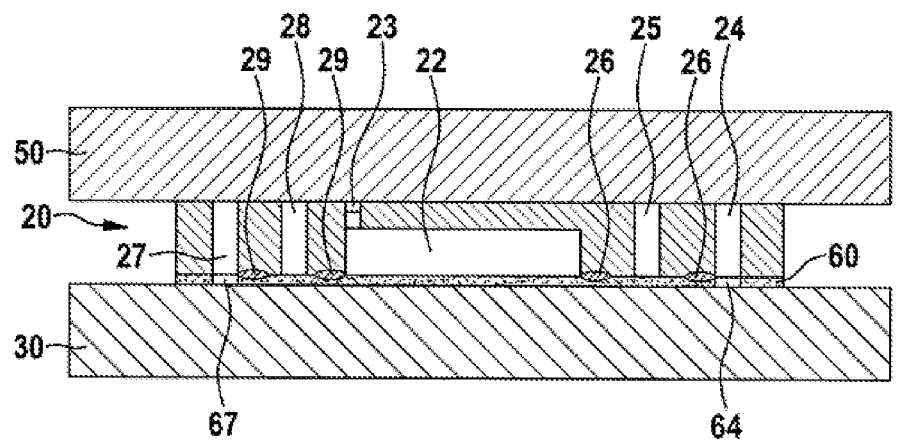
FIG. 1B shows a schematic cross-sectional view through the first polymer substrate of FIG. 1A, the latter being clamped between pressure plates.

In addition to the recess 22, the first polymer substrate 20 shown in FIGS. 1A and 1B comprises a first through-hole 24, a first auxiliary through-hole 25, a second through-hole 27 and a second auxiliary through-hole 28. The second through-hole 27 is arranged essentially opposite the first through-hole 24 in relation to the recess 22. The first auxiliary through-hole 25 is formed between the first through-hole 24 and the recess 22. The second auxiliary through-hole 28 is formed between the second through-hole 27 and the recess 22. The first and second through-holes 24, 27 and the first and second auxiliary through-holes 25, 28, respectively open into the first surface 21. In the first polymer substrate 20, a venting channel 23, which provides fluid communication between the recess 22 and a space outside the first polymer substrate 20 and which is formed essentially laterally in a plane parallel to the recess 22, is furthermore formed in the first surface 21.

A polymer membrane prefabricated for the production method according to the disclosure essentially has the same lateral dimensions as the first and second polymer substrates 20, 40. In the prefabricated polymer membrane 60, a first opening 64 is formed essentially congruently with the first through-hole 24 and a second opening 67 is formed essentially congruently with the second through-hole 27 of the first polymer substrate 20, see FIG. 1B.

The first and second polymer substrates 20, 40 are respectively produced from a light-transmissive material (i.e. one which is essentially transparent to the laser beam). The polymer membrane 60 is produced from a light-absorbing material (i.e. one which absorbs the laser light).

In a first step of the production method according to the disclosure, the first polymer substrate 20 (as shown in FIG. 1A) with the structures 22, 23, 24, 25, 28, 29 formed therein facing the prefabricated polymer substrate 60, is applied congruently onto the polymer substrate. The intermediate composite formed in this way is applied on a light-absorbing base plate 30. The base plate 30 is in this case used as a first (lower) pressure plate 30. A second pressure plate 50 is applied onto the stack, as shown in FIG. 1B. The polymer membrane 60 is then joined to the first polymer substrate 20 along a first contour 26 which extends around the first auxiliary through-hole 25, and to the first polymer substrate 20 along a second contour 29 which extends around the second auxiliary through-hole 28. Laser welding is used for the joining. A laser beam (not shown in FIG. 1B) is in this case directed (for example focused) in FIG. 1B from above through the second pressure plate 50 and the thickness of the first polymer substrate 20 onto the polymer membrane 60, and guided along the first contour 26 and along the second contour 28. The polymer membrane then melts along the first and second contours 26, 29, and enters into a material-fit connection with the first polymer substrate 20 along the contours 26, 29.

Figure 2A:
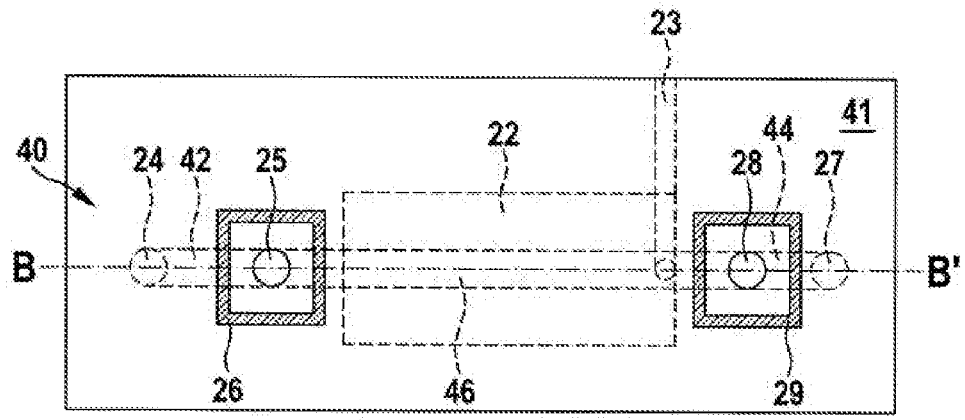
FIG. 2A shows a schematic plan view of a polymer stack comprising the first polymer substrate and the second polymer substrate arranged underneath, according to a first embodiment.
Figure 2B:
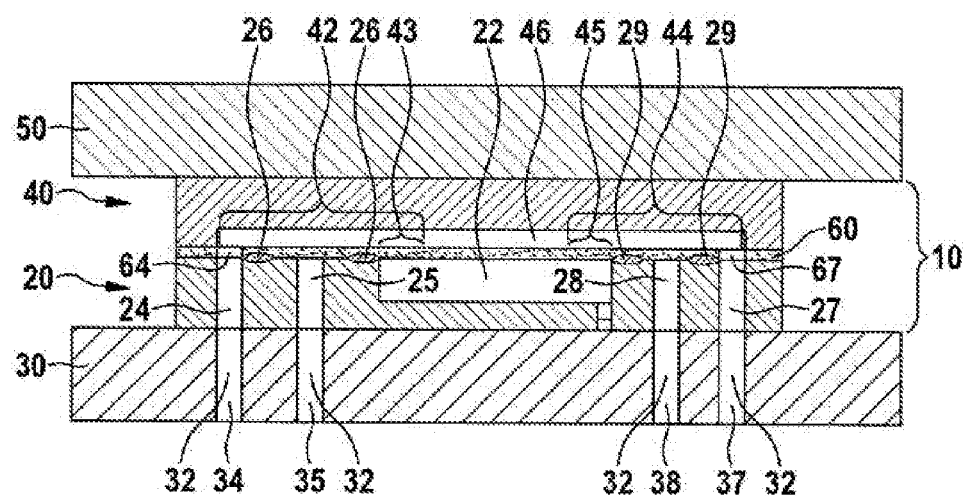
FIG. 2B shows a schematic cross-sectional view through the polymer stack of FIG. 2A (comprising the first polymer substrate, the polymer membrane and the second polymer substrate), this polymer stack being clamped between pressure plates.
Figure 3:
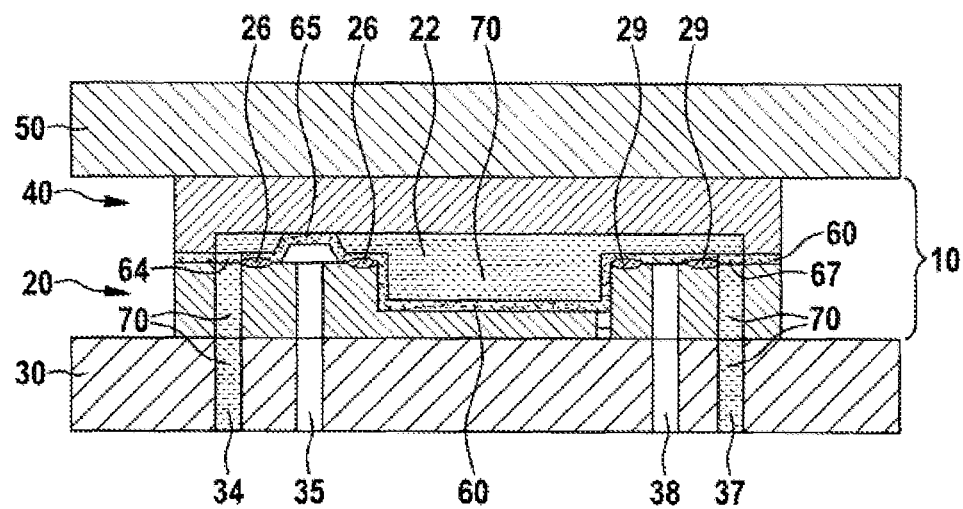
FIG. 3 shows a schematic cross-sectional view of the polymer stack of FIG. 2B, clamped between pressure plates, after a first process step of filling with fluid.
Figure 4:
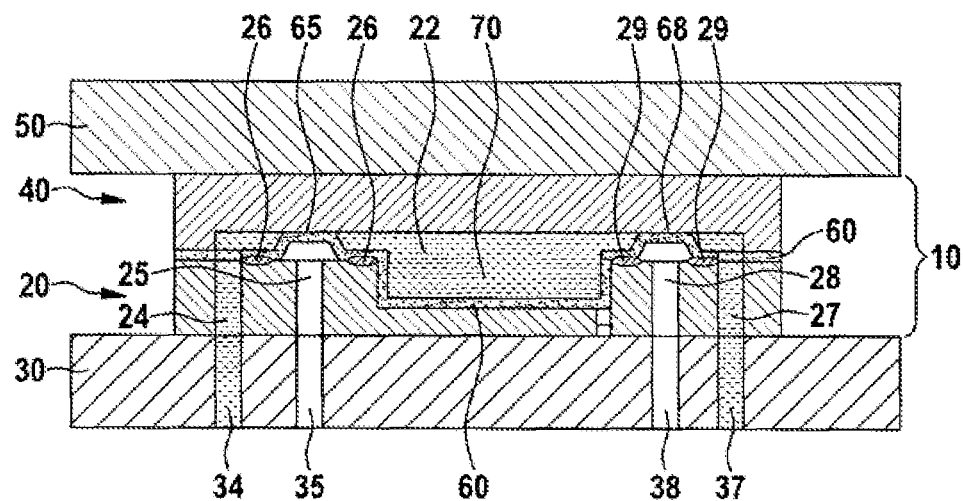
FIG. 4 shows a schematic cross-sectional view of the polymer stack of FIG. 3, clamped between pressure plates, after a further process step of applying a positive pressure.
Figure 5:
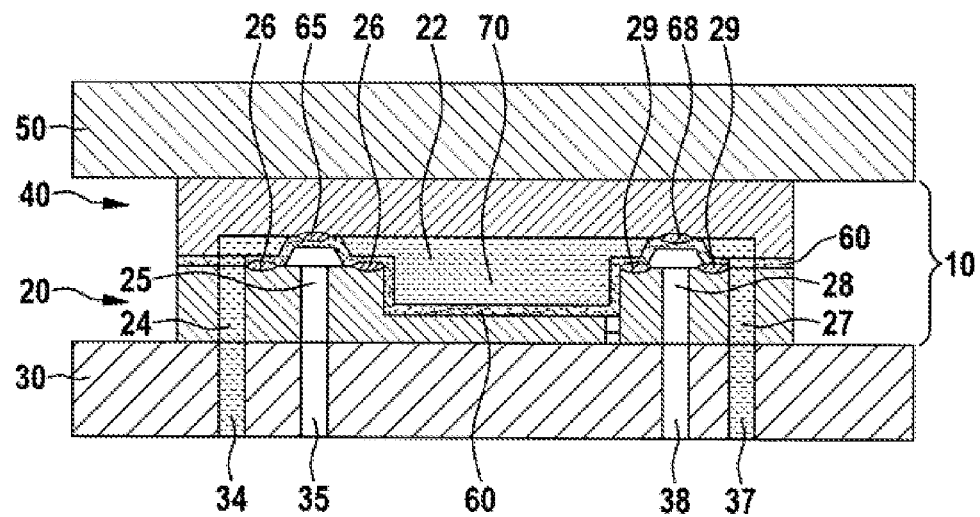
FIG. 5 shows a schematic cross-sectional view of the polymer stack of FIG. 4, clamped between pressure plates, after a further process step of joining the polymer membrane to the second polymer substrate in subregions.

The joined intermediate composite, consisting of the first polymer substrate 20 and the polymer membrane 60, is then removed from the base plate 30, rotated, and applied on the base plate 30 again, as shown in FIG. 2B. A second prefabricated polymer substrate 40, which is essentially formed congruently with the first polymer substrate 20 and the polymer membrane 60, is furthermore applied, with the structures 44, 46 formed in the second surface 41 of the second polymer substrate 40 facing the already joined intermediate composite, onto this intermediate composite and pressed with the second pressure plate 50 (in FIG. 2B from above).

The prefabricated second polymer substrate 40 comprises the second surface 41, in which a first channel 42 and a second channel 44 are formed. In this case, the first and second channels 42, 44 may additionally be connected directly to one another by a connecting channel 46, see for example FIG. 2A. The first channel 42 is formed in such a way that, when the second surface 41 is applied on the polymer membrane 60 arranged in between, which bears on the first surface 21, the first channel 42 connects together the region which is arranged in the second surface 41 in extension of the first through-hole 24, the region which is arranged in the second surface 41 in extension of the first auxiliary through-hole 25, and a closely lying first region 43 which is arranged in the second surface 41, facing a corresponding subregion of the recess 22. In a corresponding way, the second channel 44 is formed in such a way that it connects together the region which is arranged in the second surface 41 in extension of the second through-hole 27, the region which is arranged in the second surface 41 in extension of the second through-hole 28, and a closely lying second region 45 which is arranged in the second surface 41, facing a subregion of the recess 22, as shown in FIGS. 2A and 2B.

The base plate 30 of the pressing device in FIG. 2B in turn likewise contains four through-holes 34, 35, 37, 38, which are arranged essentially congruently with the through-holes 24, 25, 27 and 28 in the first polymer substrate 20 and thereby fluidically contact the latter. In addition, the through-holes 34, 35, 37, 38 in the base plate 30 and the corresponding through-holes 24, 25, 27, 28 in the first polymer substrate are sealed, for example with O-rings (not shown).

In a further process step (cf. FIG. 3), the second channel 44, the recess 22, the connecting channel 46 and the first channel 42 are filled with a fluid for pre-storage through the third through-hole 27 in the base plate 30 and the second through-hole 27 in the first polymer substrate and the second opening 67 in the polymer substrate 60, until the fluid just begins to emerge through the first opening 64 in the polymer membrane 60, the first through-hole 24 in the first polymer substrate 20 and the first through-hole 34 in the base plate 30. A positive pressure is then applied in the compressed polymer stack 20, 60, 40 through the second through-hole 35 in the base plate 30 and the first auxiliary through-hole 25 in the first polymer substrate 20, so that the polymer membrane 60 is raised in a region in extension of the first auxiliary through-hole 25 and pressed against the wall of the first channel 42. By the thereby induced sealing of the first channel 42 and simultaneous further supply of fluid through the through-holes 37, 27, the polymer membrane 60 extends into the recess 22 (the cavity) and is finally essentially pressed against the inner wall of the recess 22. The elastic polymer membrane 60 is in this case prestressed. Any air contained in the recess 22, between the polymer membrane 60 and the first polymer substrate 20, can then escape through the venting channel 23, see FIG. 3.

In a further process step (cf. FIG. 4), a positive pressure is applied in the compressed polymer stack 20, 60, 40 through the fourth through-hole 38 in the base plate and the second auxiliary through-hole 28 in the polymer substrate, so that the polymer membrane 60 is raised in a region in extension of the second auxiliary through-hole 28 and pressed onto the wall of the second channel 44. In this way, the fluid is enclosed in the recess 22, see FIG. 4.

In a further process step (cf. FIG. 5), the polymer membrane 60 is joined to the second polymer substrate 40 in those regions (at 65 and 68 in FIG. 5) which are in contact with the walls of the channels 42 and 44. This is done, in particular, by means of laser welding. In this case, the polymer membrane 60 is exposed (and for example focused) to a laser beam (not shown) through the transparent second pressure plate 50, thereby melted and welded to the polymer substrate 40, see FIG. 5.

Figure 6:
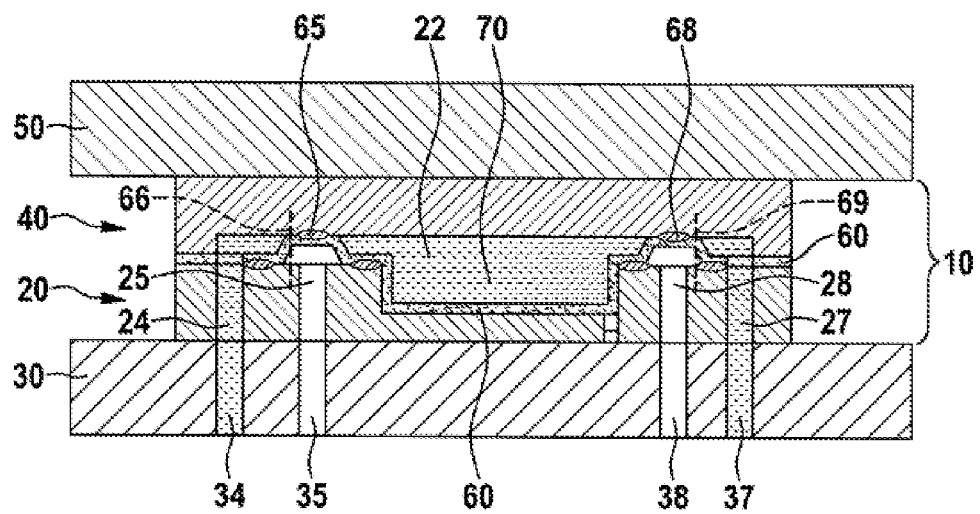
FIG. 6 shows a schematic cross-sectional view of the polymer stack of FIG. 6, clamped between pressure plates, after a further process step of separating the polymer membrane in regions between the through-holes and the auxiliary through-holes.

In a further, in particular optional, process step (cf. FIG. 6), the polymer membrane 60 is separated by a laser beam with a higher power of the laser in a first region, or a first separating position 66, which lies between the first contact position 65 and the first opening 64, and in a second region at a second separating position 69, which lies between the second contact position 68 and the second opening 67, see FIG. 6.

Figure 7:
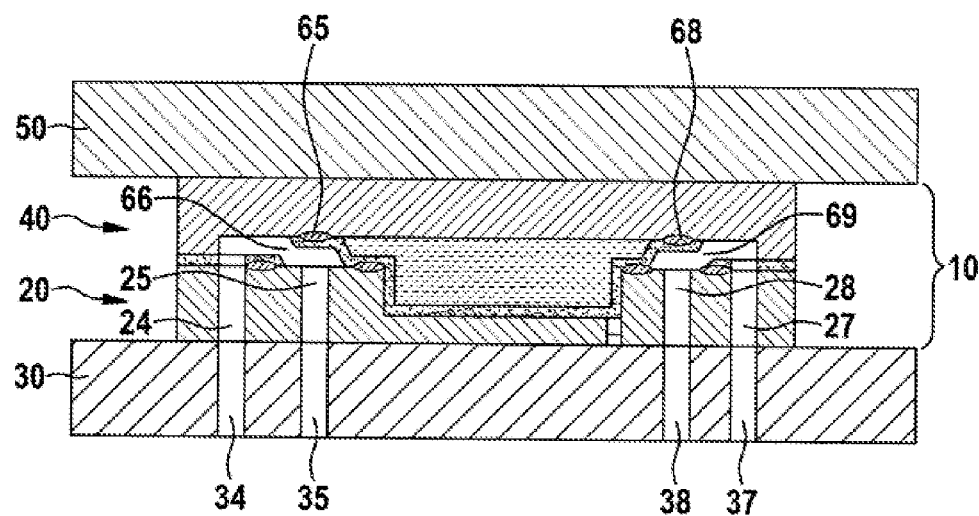
FIG. 7 shows a schematic cross-sectional view of the polymer stack of FIG. 7, clamped between pressure plates, after a further process step of expelling the fluid from the through-holes.

After the separation at the separating positions 66, 69, the positive pressure at the first auxiliary through-hole 25, or the second auxiliary through-hole 28, can displace the fluid lying outside the contact positions 65, 68 in the first or second channel 42, 44, respectively, through the first through-hole 24 and the first through-hole 34, or through the second through-hole 27 and the third through-hole 37, and thereby discharge the excess fluid in a controlled way, see FIG. 7.

In a further process step, the remainder of the surfaces 21 and 41, that is to say the regions outside the recess 22 and outside the already joined contact positions 65, 68, are joined to the polymer membrane 60. In particular, this is also done by means of laser welding. In this case, the laser beam (not shown) is again directed (and for example focused) through the second pressure plate 50 and the second polymer substrate 40 onto the polymer membrane 60 and the remaining region (i.e. the region to be joined) of the surfaces 21 and 41 are scanned with the (for example focused) laser beam, thereby melted and welded to the polymer substrate 40.

In a further embodiment (not shown), the walls of the first and/or second channels 42 and 44 are chamfered in the regions (around 65 and around 68 in FIGS. 6 and 7). This ensures that, when positive pressure is applied to the auxiliary through-holes 25, 28, polymer membrane 60 deflected into the channels 42, 44 is in contact with the channel wall essentially everywhere, which improves the leaktightness.

In yet another embodiment (not shown), the indentation 22 may be obviated or the indentation 22 may be configured only comparatively shallowly. This embodiment is expedient when the amount of fluid to be pre-stored is small and pre-storage under pressure is not required.

Figure 8A:
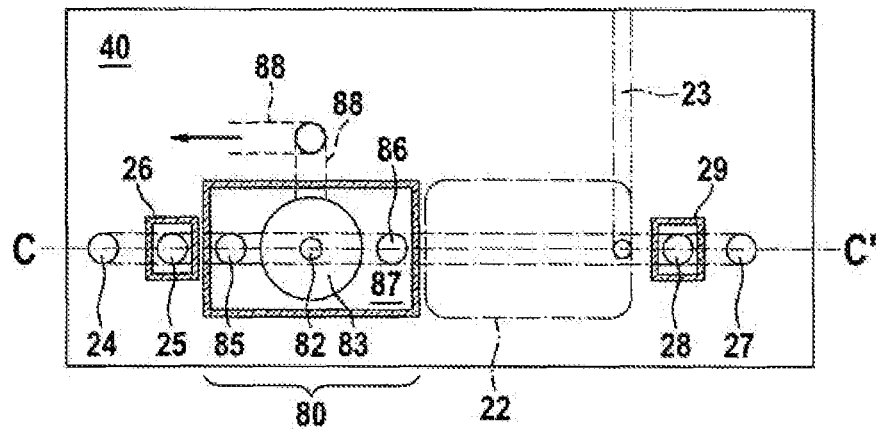
FIG. 8A shows a schematic plan view of a polymer stack comprising the first polymer substrate with a burst valve formed therein and the second polymer substrate arranged underneath, according to a second embodiment.
Figure 8B:
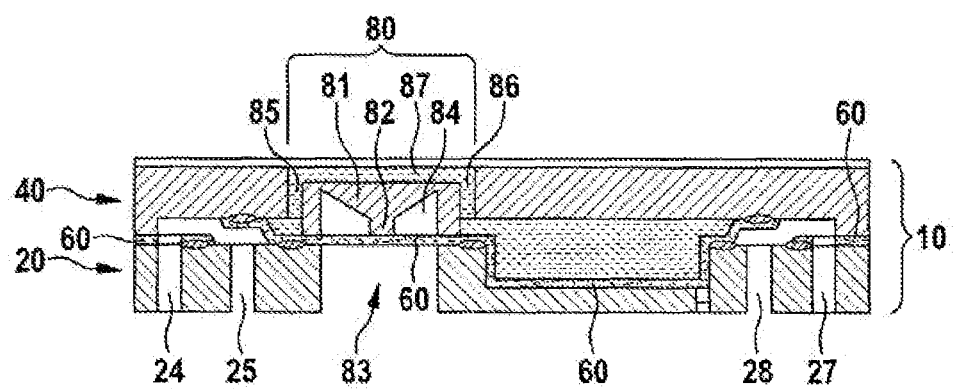
FIG. 8B shows a schematic cross-sectional view through the polymer stack of FIG. 2A, comprising the first polymer substrate, the polymer membrane and the second polymer substrate, this polymer stack being clamped between pressure plates.

In a second embodiment of the disclosure, shown in FIGS. 8A and 8B, the microfluidic storage device 10 furthermore comprises at least one breakthrough valve 80 for emptying the pre-stored fluid 70. The breakthrough valve 80 is essentially formed in an opening 83 in the first polymer substrate 20 comprises a valve antechamber 87, which is in fluid communication with the recess 22. At least in subregions, the valve antechamber 87 may be formed so as to lie opposite the first or second channel 42, 44 in the second polymer substrate 40, and may furthermore be formed between the recess 22 and the first or second auxiliary through-hole 25, 28, as shown in FIGS. 8A and 8B. The breakthrough valve 80 furthermore comprises a valve sealing section 81 which, for example, is formed conically and has a large-area end and a small-area end, the large-area end delimiting the valve antechamber 87. At the small-area end, a pin 82 is formed which is used to activate the burst valve 80, as described further below and with reference to FIG. 9A.

The first channel 42 of FIGS. 1 to 7 is modified in the second embodiment of FIGS. 8A and 8B, and is formed around the burst valve 80. The modified first channel comprises a channel section which lies opposite the first through-hole 24 and the first auxiliary through-hole 25, and a first filling through-hole 85, the valve antechamber 87, a second filling through-hole 86 and a section which leads into or across the indentation 22, as can be seen best in FIG. 8B.

The burst valve 80 is activated by exerting a pressure (not shown) on the pin 82, for example in the direction toward the large-area end of the valve sealing section 81. The large-area end of the valve sealing section 81 is then torn off from the inner wall of the opening 83 along a narrow circumferential web and releases an escape opening for the valve antechamber 87. The fluid, which is under a pre-pressure owing to the prestressed elastic polymer membrane 60, flows, driven by the pre-pressure, through the resulting escape opening and is thereby released.

Possible constructions, two variants 180, 280 and the functionality of the burst valve installed in the storage device 10 according to the disclosure of FIGS. 8A and 8B, and the functionality thereof, will be explained in even more detail below with reference to FIGS. 9A and 9B.

Figure 9A:
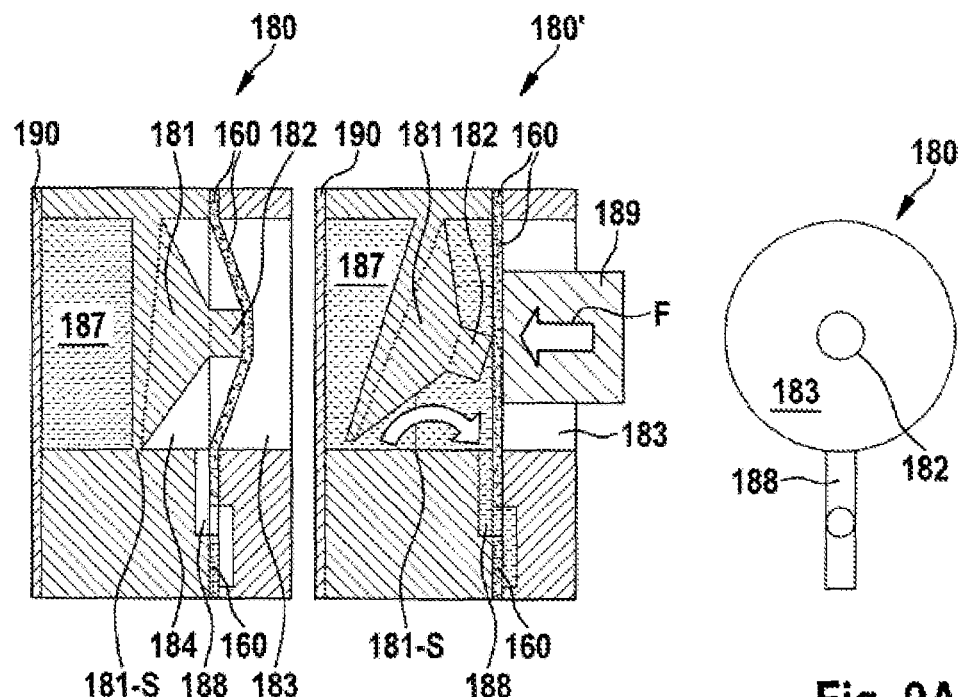
FIG. 9A shows a schematic cross-sectional view through a polymer stack comprising a first polymer substrate, a polymer membrane and a second polymer substrate, a burst valve in a first variant being formed in the first polymer substrate.

In a first embodiment, which is shown in FIG. 9A, a burst valve 180, 180' is arranged in an opening 183 of a polymer substrate. The burst valve 180 comprises an essentially conically formed valve sealing section 181 and a pin 182 formed at the thinner, or rear end of the valve sealing section 181. The wider end of the valve sealing section 181 delimits a valve antechamber 187, which is arranged at least partially inside the opening 183. On the circumference of the wider end of the conical valve sealing section 181, the valve sealing section 181 is connected by a narrow circumferential web to the polymer substrate surrounding the opening 183. The circumferential web is torn off when a pressure is exerted on the pin 182, and thus forms an opening, or fluid communication from the valve antechamber 187 into the cavity 184 and furthermore into a channel 188, which is in fluid communication with the cavity 184, for discharging or emptying fluid, which can be emptied from the previously sealed valve antechamber 187 after the tearing off and release of the opening.

In the first embodiment of FIG. 9A, the circumferential web around the wider end of the valve sealing section 181 is formed with a nonuniform width, and is narrowest at a predefined intended breaking position 181-S, so that the tearing, or an opening, always occurs at this predefined position 181-S and it is moreover ensured that the valve sealing section 181 remains connected by the pin 182 to the wall of the opening 183 and cannot migrate into other regions of the microfluidic channel system.

The polymer membrane 160 extends laterally through the opening 183 and delimits the cavity 184 released by the tearing of the web, or by the formation of the opening, and, as in the exemplary embodiment of FIG. 9A, for example also the outflow channel 188.

The pressure is applied onto the pin 182 by a stamp 189, cf. also the force F, shown in FIG. 9A, acting on the stamp 189. In this case, the stamp 189 acts on the pin 182 through the polymer membrane 160.

With the exception of the nonuniform circumferential web and the outflow channel 188 opening radially into the cavity 184, the burst valve 180, 180' in FIG. 9A is essentially formed axially symmetrically, as can be seen in the plan view in the right-hand part of FIG. 9A. In the left-hand part of FIG. 9A, the burst valve 180 is shown in the closed state. In this case, the polymer membrane 160 may be prestressed by means of the pin 182. In the central region of FIG. 9A, the burst valve 180' is shown in the open state. In this case, the stamp 189 has acted on the pin 182, the valve sealing section 182 has torn off at the intended breaking position 181-S and has released the opening from the valve antechamber 187 into the cavity 184 and the outflow channel 188.

Figure 9B:
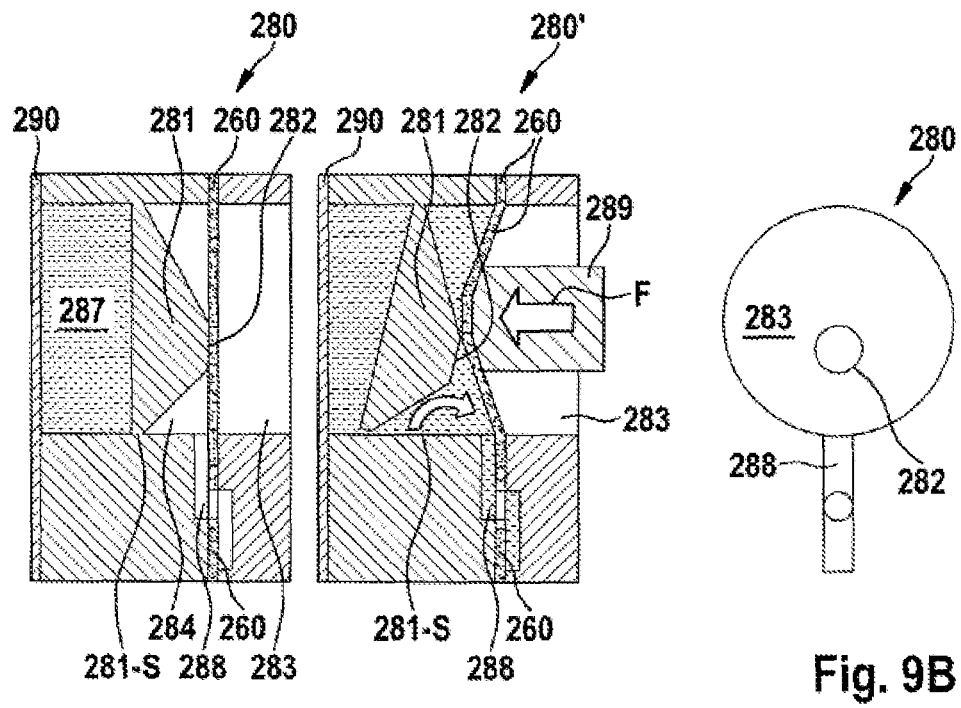
FIG. 9B shows a schematic cross-sectional view through a polymer stack in a similar way as in FIG. 9A, a burst valve in a second variant being formed in the first polymer substrate.

In a second embodiment, shown in FIG. 9B, a burst valve 280, 280' is arranged in an opening 283 of a polymer substrate and comprises a valve sealing section 281, which is formed eccentrically conically and therefore differs from the essentially conical valve sealing section 181 of the first embodiment shown in FIG. 9A. The valve sealing section 281 is connected at its wider end (on the left in FIG. 9B) by a circumferential web to the wall of the opening 283 and delimits a valve antechamber 287. At its narrower end (on the right in FIG. 9B), the valve sealing section 281 may have a pin (not shown) or a flat 282 (as shown in FIG. 9B). The pin (not shown), or the flat 282, are arranged off-center in the opening 283, as can be seen best in the plan view in the right-hand part of FIG. 9B.

In order to actuate the burst valve 280, a pressure is exerted off-center onto the narrower end, for example the flat 282, of the valve sealing section 281 by means of a stamp 289, cf. the force F, indicated in the central region of FIG. 9B, exerted by the stamp 289. The effect of the off-center arrangement of the point of transmission of the force F onto the off-center rear end of the valve sealing section 281 is that the circumferential web is preferentially torn off at an intended breaking position 281-S from the wall of the opening 283 which lies closest to the off-center force transmission point. This can be additionally reinforced by a nonuniform configuration of the circumferential web, which, as in the embodiment shown in FIG. 9A, may be formed so that it is narrowest at the predefined intended breaking position 281-S.

Similarly as in the embodiment shown in FIG. 9A, the polymer membrane 260 delimits the cavity 284 which is released when the web is torn, or when the opening is released, and the channel 288 for discharging of the fluid.

The structures required in the microfluidic systems (that is to say the elements 22, 23, 24, 25, 27, 28, or the elements 42, 44, 46 (as shown for example in FIG. 2), or the elements 83, 81, 82 (as shown in FIG. 8B), or the elements 85, 86, 87 (as likewise shown in FIG. 8B), or the elements 187, 181, 182 (as shown in FIG. 9A) or the elements 287, 281 (as shown in FIG. 9B), may, for example, be produced by milling, injection molding, hot pressing or laser structuring. Breakthroughs, or openings, of the polymer membrane 60, 160, 260, such as the openings 64, 67 (as shown in FIG. 2B), may for example be produced by stamping or laser structuring.

The polymer substrates, for instance the first and second polymer substrates 20, 40 or 180, 280, may be produced from thermoplastics, for example PC, PP, PE, PMMA, COP, or COC.

The polymer membrane 60, 160, 260 may be produced from an elastomer, a thermoplastic elastomer, thermoplastics or hot-melt adhesive films, the selected material providing the required elasticity.

Exemplary geometrical dimensions for the embodiments shown are as follows. The lateral dimension of the polymer substrates 20, 40 may be selected in the range of from about 10×10 mm$^2$ to about 20×20 mm$^2$. The thickness of the polymer substrate may be selected in the range of from about 0.5 to 5 mm. The thickness of the polymer membrane may be selected in the range of from about 5 to 300 μm. The volume of the recess 22 may be selected in the range of from about 1 mm$^3$ to 1000 mm$^3$.

LIST OF REFERENCES 10 microfluidic storage device
20 first polymer substrate
21 first surface
22 recess
22' free region
23 venting channel
24 first through-hole
25 first auxiliary through-hole
26 first contour
27 second through-hole
28 second auxiliary through-hole
29 second contour
30 first pressure plate or base plate
32 through-holes
34 first through-hole
35 second through-hole
37 third through-hole
38 fourth through-hole
40 second polymer substrate
41 second surface
42 first channel
43 first region
44 second channel
45 second region
46 connecting channel
50 second pressure plate
60 polymer membrane
64 first opening
65 first contact position
66 first separating position
67 second opening
68 second contact position
69 second separating position
70 fluid
80 breakthrough valve
81 valve sealing section
82 pin
83 opening
84 cavity
85 first filling through-hole
86 second filling through-hole
87 valve antechamber
88 channel
90 cover layer
160 polymer membrane
180, 280 breakthrough valve (closed)
180', 280' breakthrough valve (open)
181, 281 valve sealing section
181-S, 282-S intended breaking position
182 pin
282 flat
183, 283 opening
184, 284 cavity
187, 287 valve antechamber
188, 288 channel
189, 289 stamp
F force
190, 290 cover layer

What is claimed is:

1. A microfluidic storage device for pre-storing a fluid, comprising:
a first polymer substrate having a laterally extending recess formed in a first surface and defining a first through-hole, a first auxiliary through-hole arranged between the first through-hole and the recess, a second through-hole arranged essentially opposite the first through-hole in relation to the recess, and a second auxiliary through-hole arranged between the second through-hole and the recess;
a second polymer substrate having a second surface essentially formed to match the first surface with a form fit at least in subregions outside the recess, wherein the second surface of the second polymeric substrate defines a first channel and a second channel; and
an elastic polymer membrane arranged between the first polymer substrate and the second polymer substrate, the elastic polymer membrane being in contact with the first surface and the second surface in regions outside the recess, the elastic polymer membrane being configured, in a region of the recess, to essentially line the recess such that a volume region inside the recess, between the elastic polymer membrane and the second polymer substrate, is configured to be filled with the fluid,
wherein the first polymer substrate, the elastic polymer membrane and the second polymer substrate are joined to one another, at least in subregions outside the recess in which the elastic polymer membrane is in contact with the first surface and the second surface, and
wherein the elastic polymer membrane is joined to a first wall of the first channel at a first contact region opposite the first auxiliary through-hole and to a second wall of the second channel at a second contact region opposite the second auxiliary through-hole in such a way that the volume region inside the recess is sealed from the first through-hole and the second through-hole.

2. A microfluidic storage device, comprising:
a first polymer substrate having a laterally extending recess formed in a first surface;
a second polymer substrate having a second surface essentially formed to match the first surface with a form fit at least in subregions outside the recess;
a base layer positioned on the first polymer substrate opposite the second polymer substrate; and
an elastic polymer membrane arranged between the first polymer substrate and the second polymer substrate, the elastic polymer membrane in contact with the first surface and the second surface in regions outside the recess, the elastic polymer membrane configured, in a region of the recess, to essentially line the recess such that essentially a volume region inside the recess, between the elastic polymer membrane and the second polymer substrate, is configured to be filled with the fluid,
wherein the first polymer substrate, the elastic polymer membrane and the second polymer substrate are configured to be joined to one another at least in subregions, outside the recess, in which the elastic polymer membrane is in contact with the first surface and the second surface,
wherein the first polymer substrate defines a first through-hole, a first auxiliary through-hole formed between the first through-hole and the recess, a second through-hole arranged essentially opposite the first through-hole in relation to the recess, and a second auxiliary through-hole formed between the second through-hole and the recess, and
wherein the base layer defines a first base through-hole aligned with the first through hole, a second base through-hole aligned with the second through-hole, a first base auxiliary through-hole aligned with the first auxiliary through-hole, and a second base auxiliary through-hole aligned with the second auxiliary through-hole.

3. The microfluidic storage device as claimed in claim 1, further comprising a venting channel formed in the first polymer substrate and configured to provide fluid communication between the recess and a space outside the storage device.

4. The microfluidic storage device as claimed in claim 2, wherein:
the first channel is configured such that, when the second surface of the second polymer substrate is applied onto the first surface of the first polymer substrate with the elastic polymer membrane arranged between them, the first channel connects together (i) a region arranged in the second surface in extension of the first through-hole, (ii) a region arranged in the second surface in extension of the first auxiliary through-hole, and (iii) a closely lying first region arranged in the second surface, facing a first subregion of the recess, and
the second channel is configured such that, when the second surface of the second polymer substrate is applied onto the first surface of the first polymer substrate with the elastic polymer membrane arranged between them, the second channel connects together (i) a region arranged in the second surface in extension of the second through-hole, (ii) a region arranged in the second surface in extension of the second auxiliary through-hole, and (iii) a closely lying second region arranged in the second surface, facing a second subregion of the recess.

5. The microfluidic storage device as claimed in claim 2, wherein the first channel and the second channel are connected together in a region which lies on the second surface, facing the recess.

6. The microfluidic storage device as claimed in claim 2, wherein the elastic polymer membrane is joined to a first wall of the first channel at a first contact region opposite the first auxiliary through-hole and is joined to a second wall of the second channel at a second contact region opposite the second auxiliary through-hole.

7. The microfluidic storage device as claimed in claim 1, wherein the volume region in the recess between the elastic polymer membrane and the second surface is filled with the fluid.

8. The microfluidic storage device as claimed in claim 2, wherein at least one of the first through-hole, the first auxiliary through-hole, the second through-hole and the second auxiliary through-hole is closed by a polymer stamp.

9. The microfluidic storage device as claimed in claim 1, further comprising at least one breakthrough valve having a valve antechamber, the breakthrough valve formed in the first polymer substrate and the valve antechamber in fluid communication with the recess.

10. The microfluidic storage device as claimed in claim 1, wherein:
the elastic polymer membrane is configured to absorb light which the first and second polymer substrates are configured to transmit, and
the light is configured to join the elastic polymer membrane to the second polymer substrate at the first and second contact regions.

11. The microfluidic storage device as claimed in claim 6, wherein the wall of the first channel and the wall of the second channel are each formed with a chamfer in regions in which the elastic polymer membrane is curved.

12. A lab-on-a-chip, comprising:
- a microfluidic storage device configured to pre-store a fluid, the microfluidic storage device including:
  - a first polymer substrate having a laterally extending recess formed in a first surface and defining a first through-hole, a first auxiliary through-hole arranged between the first through-hole and the recess, a second through-hole arranged essentially opposite the first through-hole in relation to the recess, and a second auxiliary through-hole arranged between the second through-hole and the recess;
  - a second polymer substrate having a second surface essentially formed to match the first surface with a form fit at least in subregions outside the recess, wherein the second surface of the second polymeric substrate defines a first channel and a second channel; and
  - an elastic polymer membrane arranged between the first polymer substrate and the second polymer substrate, the elastic polymer membrane in contact with the first surface and the second surface in regions outside the recess, the elastic polymer membrane configured, in a region of the recess, to essentially line the recess such that a volume region inside the recess, between the elastic polymer membrane and the second polymer substrate, is configured to be filled with the fluid,
- wherein the first polymer substrate, the elastic polymer membrane and the second polymer substrate are joined to one another, at least in subregions outside the recess in which the polymer membrane is in contact with the first surface and the second surface, and
- wherein the elastic polymer membrane is joined to a first wall of the first channel at a first contact region opposite the first auxiliary through-hole and to a second wall of the second channel at a second contact region opposite the second auxiliary through-hole in such a way that the volume region inside the recess is sealed from the first through-hole and the second through-hole.

13. The microfluidic storage device as claimed in claim 1, wherein the elastic polymer membrane is welded to the first wall at the first contact region and to the second wall at the second contact region.

14. The microfluidic storage device as claimed in claim 1, wherein the elastic polymer membrane is joined to the first wall at the first contact region and to the second wall at the second contact region by a polymer stamp.

15. The lab-on-a-chip as claimed in claim 12, wherein the elastic polymer membrane is welded to the first wall at the first contact region and to the second wall at the second contact region.

16. The lab-on-a-chip as claimed in claim 12, wherein the elastic polymer membrane is joined to the first wall at the first contact region and to the second wall at the second contact region by a polymer stamp.

* * * * *